US012592672B2

(12) United States Patent
Noro

(10) Patent No.: US 12,592,672 B2
(45) Date of Patent: Mar. 31, 2026

(54) POWER AMPLIFIER

(71) Applicant: Yamaha Corporation, Hamamatsu (JP)

(72) Inventor: Masao Noro, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 480 days.

(21) Appl. No.: 18/449,526

(22) Filed: Aug. 14, 2023

(65) Prior Publication Data

US 2024/0056038 A1 Feb. 15, 2024

(30) Foreign Application Priority Data

Aug. 15, 2022 (JP) ................................. 2022-129265

(51) Int. Cl.
H03F 3/21 (2006.01)
(52) U.S. Cl.
CPC .......... H03F 3/211 (2013.01); H03F 2200/03 (2013.01)
(58) Field of Classification Search
CPC . H03F 3/211; H03F 3/183; H03F 3/21; H03F 3/45475; H03F 2200/03; H03F 1/3217
USPC ......... 330/291, 150, 152, 260, 310, 85, 293, 330/98–100, 107, 109
See application file for complete search history.

(56) References Cited

U.S. PATENT DOCUMENTS

| | | | | |
|---|---|---|---|---|
| 4,491,802 A | * | 1/1985 | Uchida | H03F 1/34 330/261 |
| 4,823,094 A | * | 4/1989 | Reiffin | H03F 3/3001 330/264 |
| 6,617,919 B2 | * | 9/2003 | Seshita | H05K 1/0237 330/66 |
| 7,652,531 B2 | * | 1/2010 | Wang | H03F 1/34 330/99 |
| 9,071,201 B2 | | 6/2015 | Jones et al. | |

* cited by examiner

*Primary Examiner* — Andrea Lindgren Baltzell
*Assistant Examiner* — Nareh Shamiryan
(74) *Attorney, Agent, or Firm* — Spencer Fane LLP

(57) ABSTRACT

A power amplifier includes a first amplifier configured to amplify an input signal and output, from a first output, a first signal in which the input signal is amplified, a second amplifier configured to amplify the first signal and output, from a second output, a second signal in which the first signal is amplified, a third amplifier configured to amplify the second signal and output, from a third output, a third signal in which the second signal is amplified, a capacitor connected between the first output and a mixing node, a first resistor connected between the second output and the mixing node, a first inductor connected between the third output and the mixing node, a second inductor connected between the mixing node and a load, and a feedback circuit configured to negatively feed back a mixed signal of the mixing node to an input of the first amplifier.

5 Claims, 5 Drawing Sheets

C: 2.2nF     R11, R12: 91Ω     L1 : 5μH
             R21, R22: 0.22Ω    L2 : 5μH
             RL :      8Ω

POWER AMPLIFIER

CROSS-REFERENCE TO RELATED APPLICATIONS

This application claims priority to Japanese Patent Application No. 2022-129265, filed on Aug. 15, 2022. The entire disclosure of Japanese Patent Application No. 2022-129265 is hereby incorporated herein by reference.

BACKGROUND

Technical Field

The present disclosure relates, for example, to a power amplifier.

Background Information

An audio power amplifier is required to amplify input signals in the audible frequency range, 20 Hz to 20 kHz, and output them to a load, such as a speaker (loudspeaker), at a low distortion factor. The technology for such low-distortion amplification is known, and is disclosed, for example, in U.S. Pat. No. 9,071,201.

U.S. Pat. No. 9,071,201 discloses a power amplifier with an amplification stage that amplifies voltage and an output stage that amplifies current, where the output stage is made up of a plurality of stages. In this configuration, impedances (Z1-Z4) are provided to cancel out distortion of the output signal. More specifically, the connection point to the load is connected to the output of the amplification stage via an impedance (Z3) and the output of the output stage via an impedance (Z1).

SUMMARY

However, since the distortion characteristics of the power amplifier disclosed in U.S. Pat. No. 9,071,201 are improved by a feed-forward path, high-precision circuit elements are required. Such high-precision circuit elements are generally expensive, resulting in the problem of high cost.

In consideration of these circumstances, an object of this disclosure is to provide a technology for improving various characteristics, such as distortion characteristics, of a power amplifier that amplifies input signals in the audible band, at low cost.

The power amplifier according to one aspect of this disclosure comprises a first amplifier configured to amplify an input signal and output, from a first output, a first signal in which the input signal is amplified, a second amplifier configured to amplify the first signal and output, from a second output, a second signal in which the first signal is amplified, a third amplifier configured to amplify the second signal and output, from a third output, a third signal in which the second signal is amplified, a capacitor connected between the first output and a mixing node, a first resistor connected between the second output and the mixing node, a first inductor connected between the third output and the mixing node, a second inductor connected between the mixing node and a load, and a feedback circuit configured to negatively feed back a mixed signal of the mixing node to an input of the first amplifier.

DETAILED DESCRIPTION OF THE EMBODIMENTS

Figure 1:
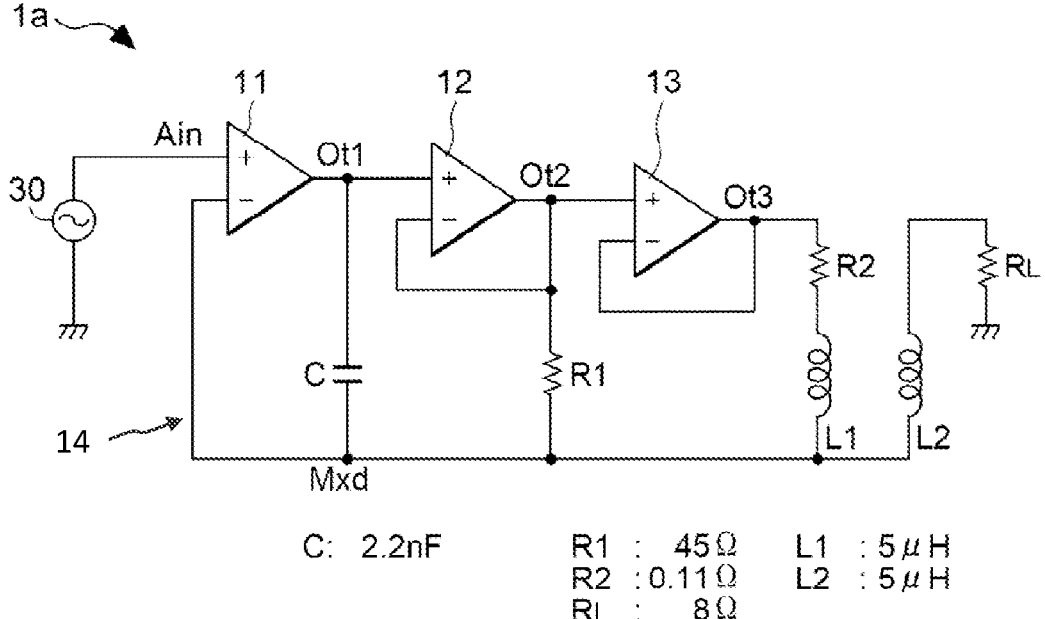
FIG. 1 is a circuit diagram showing a configuration of a power amplifier according to an embodiment.

Selected embodiments will now be explained in detail below, with reference to the drawings as appropriate. It will be apparent to those skilled from this disclosure that the following descriptions of the embodiments are provided for illustration only and not for the purpose of limiting the invention as defined by the appended claims and their equivalents.

Negative feedback is used in audio power amplifiers to reduce distortion when an input signal in the audible band is amplified. In general, the open loop gain is attenuated as the frequency increases in the high-frequency range. Stable application of negative feedback requires adjusting the open loop gain to be less than 0 dB at frequencies below the frequency at which the circuit may oscillate with a phase shift of approximately 1800 in the high-frequency range.

In a power amplifier, since the distortion that occurs in an output element of the final stage is the greatest, a large amount of negative feedback must be applied to the output element to reduce the distortion. However, since the output element of the final stage, which handles large currents, is less responsive than an output element that handles small currents, the upper limit frequency at which negative feedback can be applied is restricted to about 1 MHz. For this reason, the distortion factor of a power amplifier that handles large currents in the final stage is less favorable than a small-signal amplifier that handles small currents in the final stage and to which feedback can be applied up to about 20 MHz, or a high-performance operational amplifier formed by an integrated circuit.

In general, the impedance of a speaker, which is the load of the power amplifier, is 4 or 8Ω. A cable that connects the output of the power amplifier to a speaker input has parasitic capacitance. In order to prevent oscillations caused by the cable capacitance, an inductor (coil) of about several pH is connected to the output of the power amplifier. The actual load of the power amplifier is therefore the speaker and the inductor, and if the impedance of the speaker is 4Ω, it can be considered to be (4Ω+several μH). At frequencies of 200 kHz or more, the impedance of the load of the power amplifier is dominated by the several pH of the inductor and increases with frequency.

Assume that the negative feedback band of a power amplifier is extended from about 1 MHz to around 20 MHz. In a band around 20 MHz, the load impedance is dominated by the inductance of the coil, which will be several tens to several hundreds of Ω. In addition, band components of the input signal at such high frequencies are almost non-existent. Therefore, even if the maximum output current of such high-frequency band components is extremely small compared to the output current of the audible band, this is not a problem in practice.

Thus, audio power amplifiers are subject to different circumstances than other power amplifiers, such as radio frequency amplifiers. A power amplifier according to an embodiment configured in consideration of such circum-
stances will be described below with reference to the draw-
ings.

FIG. 1 is a circuit diagram showing the configuration of
a power amplifier 1a according to an embodiment.

The power amplifier 1a power-amplifies an input signal
Ain output from a circuit 30 and outputs the output signal to
a resistor $R_L$ representing the load. The power amplifier 1a
includes amplifiers 11, 12, 13, a capacitor C, resistors R1,
R2, and inductors L1 and L2.

In the embodiment, the amplifiers 11, 12, and 13 are
amplifiers capable of amplifying signals.

The amplifier 11 (first amplifier) amplifies an input signal
and output, from a first output, a first signal in which the
input signal is amplified. More specifically, the amplifier 11
is an operational amplifier that amplifies the differential
voltage between the input signal Ain supplied to the non-
inverting input (+) and the feedback signal from a mixing
node Mxd, which is supplied to the inverting input (−), and
outputs it as the first signal from an output Ot1 (second
output). The output Ot1 of the amplifier 11 is connected to
the non-inverting input (+) of the amplifier 12, and one of
two terminals of the capacitor C. The other terminal of the
capacitor C is connected to the mixing node Mxd. The
operational amplifier can be formed by discrete circuits, an
integrated circuit, or be a mixture of the two.

The amplifier (second amplifier) 12 amplifies the first
signal and output, from a second output, a second signal in
which the first signal is amplified. More specifically, the
amplifier 12 is a voltage buffer with a gain of "1," which, by
100% negative feedback of its output, amplifies the current
of the first signal from amplifier 11 and outputs it as the
second signal from an output Ot2. The output Ot2 of the
amplifier 12 is connected to the non-inverting input (+) of
the amplifier 13 and one of two terminals of the resistor R1
(first resistor). The other terminal of resistor R1 is connected
to the mixing node Mxd.

The amplifier (third amplifier) 13 amplifies the second
signal and output, from a third output, a third signal in which
the second signal is amplified. More specifically, the ampli-
fier 13 is a voltage buffer with a gain of "1," which, by 100%
negative feedback of its output, amplifies the current of the
second signal from the amplifier 12 and outputs it as the
third signal from an output Ot3 (third output). The output
Ot3 of the amplifier 13 is connected to one of two terminals
of the resistor R2. The other terminal of the resistor R2 is
connected to one of two terminals of the inductor L1 (first
inductor). The other terminal of the inductor L1 is connected
to the mixing node Mxd and one of two terminals of the
inductor L2 (second inductor).

The inductor L1, the resistor R1, and the capacitor C
constitute a crossover network that sets the mixing ratio of
the first signal, the second signal, and the third signal at the
mixing node Mxd, and the inductor L2 is provided for
preventing oscillation caused by the parasitic capacitance of
the cable to the resistor $R_L$.

The first signal from the amplifier 11 that has passed
through the capacitor C, the second signal from the amplifier
12 that has passed through the resistor R1, and the third
signal from the amplifier 13 that has passed through the
resistor R2 and the inductor L1, are mixed in the mixing
ratio at the mixing node Mxd, and the mixed signal is
applied to the inverting input (−) of the amplifier 11 and the
inductor L2.

In other words, the mixed signal is supplied to the resistor
$R_L$ via the inductor L2, and negatively fed back to the
amplifier 11. That is, the path through which the mixed signal at the mixing node Mxd is fed back to the inverting
input (−) of the amplifier 11 is a feedback loop 14.

In the present embodiment, for example, the capacitor C
is 2.2 μF, the resistor R1 is 45Ω, the resistor R2 is 0.11Ω, the
inductors L1 and L2 are each 5 μH, and the resistor $R_L$ is 8Ω.

In the power amplifier 1a, the amplifier 13 includes an
output element designed to handle large currents, the ampli-
fier 12 includes an output element designed to handle
smaller, medium currents, and the amplifier 11 includes an
output element designed to handle even smaller, small
currents. For this reason, the amplifier 12 can operate faster
than the amplifier 13, and the amplifier 11 can operate faster
than the amplifier 12 and the amplifier 13.

In the power amplifier 1a, the low-speed amplifier 13 that
outputs large currents, the high-speed amplifier 12 that
outputs medium currents, and the higher-speed amplifier 11
that outputs small currents operate in parallel, and the third
signal, the second signal, and the first signal output from
these amplifiers cross over according to band by the cross-
over network.

In this configuration, the slower amplifiers 12 and 13 are
connected downstage of the faster amplifier 11. Of the two,
the second signal from the front-stage amplifier 12 is applied
to the mixing node Mxd via the resistor R1, and the third
signal of the down-stage amplifier 13 is applied to the
mixing node Mxd via the resistor R2 and the inductor L1.

In the embodiment, the values of the capacitor C, the
resistor R1, and the inductor L1 are set (determined) as
follows. That is, the values of the resistor R1 and the
inductor L1 are set so that the frequency (first crossover
frequency) at which the level of the second signal from the
amplifier 12 that has passed through the resistor R1 and the
level of the third signal from the amplifier 13 that has passed
through the inductor L1 cross is higher than the roll-off
frequency set by the inductor L2 and the load resistance $R_L$.
The inductor L2 causes the load current that flows through
resistance $R_L$ to be smaller than the maximum current that
the output element of the amplifier 12 can handle at the first
crossover frequency.

The values of the capacitor C and the resistor R1 are also
set so that the frequency (second crossover frequency) at
which the level of the first signal from the amplifier 11 that
has passed through the capacitor C and the level of the
second signal from the amplifier 12 that has passed through
the resistor R1 cross is higher than the first crossover
frequency. The inductor L2 causes the load current that
flows through resistance $R_L$ to be smaller than the maximum
current that the output element of the amplifier 11 can handle
at the second crossover frequency. As specific values of the
aforementioned three frequencies, for example, the roll-off
frequency can be set to approximately 250 kHz for an 8Ω
load, the first crossover frequency can be set to approxi-
mately 1.4 MHz, and the second crossover frequency can be
set to approximately 1.6 MHz.

Figure 2:
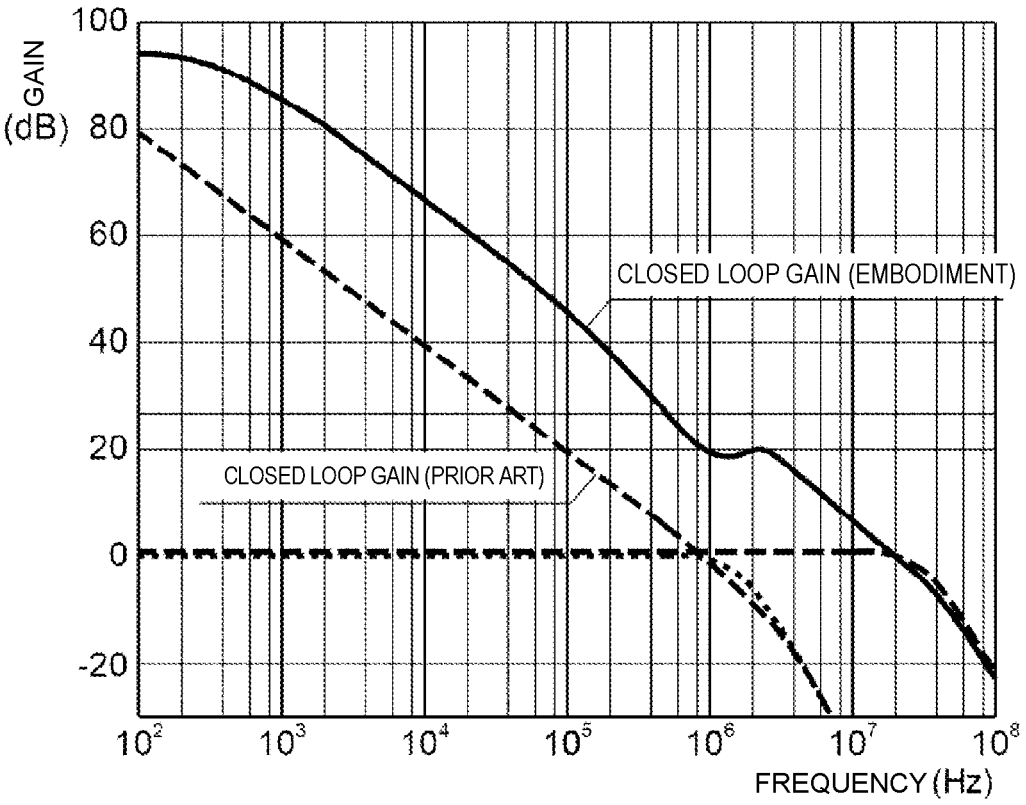
FIG. 2 is a diagram showing a gain vs frequency characteristic of the power amplifier according to the embodiment.

FIG. 2 illustrates the open loop gain vs frequency char-
acteristic for the power amplifier 1a according to the
embodiment. For comparison, FIG. 2 also shows the open
loop gain of a conventional power amplifier. In the conven-
tional power amplifier, the output element of the final stage
is a low-speed element that can handle large currents, and,
to prevent oscillations when negative feedback is applied,
the frequency response of the open loop gain is limited so
that the frequency at which the gain, which decays at 6
dB/octave toward the high-frequency region, reaches 0 dB is
approximately 1 MHz.

As shown in FIG. 2, in the power amplifier 1a according
to the embodiment, the frequency at which the open loop gain decreases to 0 dB is around 20 MHz, so that when the closed loop gain is set to 0 dB as in FIG. 1, negative feedback is applied at around 20 MHz. When the power amplifier 1a is compared to the prior art, at this same frequency, the amount of feedback in a band of 1 kHz or more increases by about 26 dB, i.e., about 20 times. In the embodiment, negative feedback can be evenly applied more deeply in the high band than in the prior art, and the upper limit of the band to which negative feedback is applied is also expanded, so that voltage distortion of the output waveform can be further reduced in the power amplification in the audible range.

Moreover, in the present embodiment, since the distortion characteristics are improved by ordinary negative feedback, high-precision circuit elements are not required, as is the case with the conventional feed-forward method. For this reason, in the embodiment, various characteristics, such as the distortion characteristics, of a power amplifier that amplifies input signals in the audible band can be improved at low cost.

In the power amplifier 1a of FIG. 1, the closed loop gain of the mixed signal with respect to the input signal Ain is 0 dB (lx) up to approximately 20 MHz, as shown in FIG. 2. However, this is the voltage gain at the mixing node Mxd ahead of the inductor L2, and not the voltage gain with respect to the output signal that is applied to the load resistor $R_L$. The roll-off frequency is well away (50 kHz or higher) from the audible band of 20 Hz-20 kHz, so that, in terms of the audible band, the voltage gain of the output signal, that is applied to the load resistor $R_L$, with respect to the input signal of the power amplifier 1a is the same value as the closed loop gain, i.e., 0 dB (1×).

Figure 3:
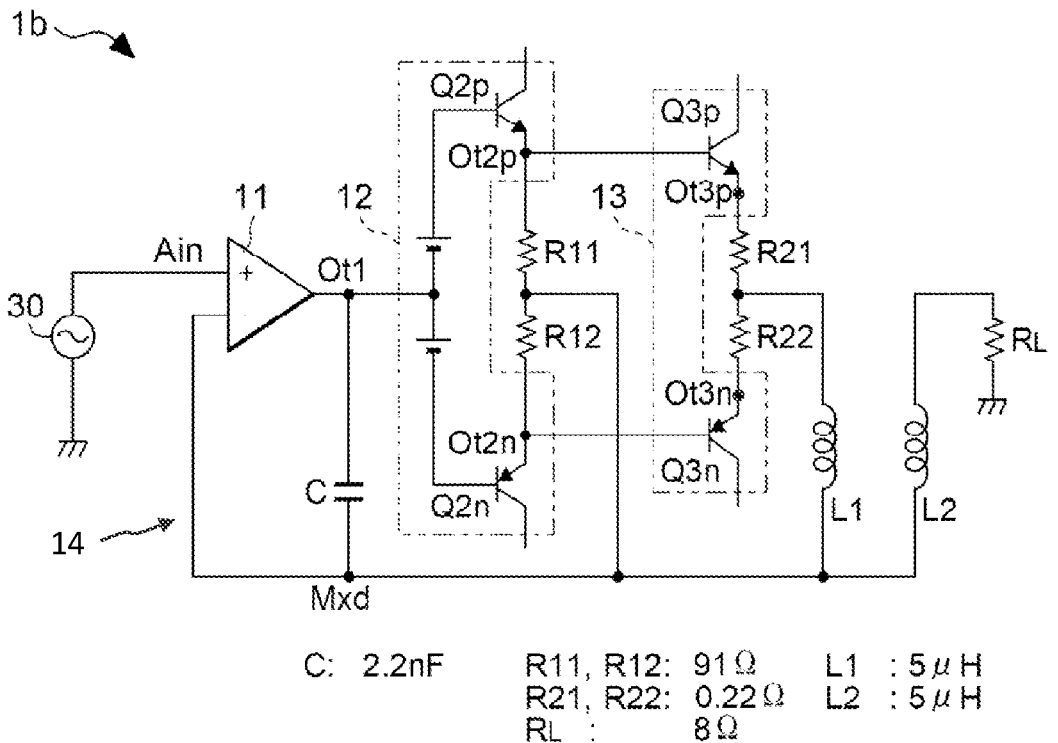
FIG. 3 is a diagram showing a specific example of the power amplifier.

FIG. 3 shows a circuit diagram of a power amplifier 1b according to a specific example of the power amplifier 1a according to the embodiment.

The buffer amplifiers 12 and 13 of the power amplifier 1a, each having a voltage amplification factor of "1," are configured in the power amplifier 1b as emitter followers using complementary bipolar transistors, according to the specific example. Specifically, in power amplifier 1b, the amplifier 12 is an emitter follower including an npn transistor Q2p and a pnp transistor Q2n, the collectors of which are connected to the positive and negative power supply rails, respectively, and the amplifier 13 is an emitter follower including an npn transistor Q3p and a pnp transistor Q3n, the collectors of which are connected to the positive and negative power supply rails, respectively.

The output Ot2 from the amplifier 12 to the amplifier 13 in FIG. 1 corresponds to the emitter output Ot2p of the positive-side transistor Q2p and the emitter output Ot2n of the negative-side transistor Q2n in FIG. 3. Resistors R11 and R12 are connected in series between the emitter outputs Ot2p and Ot2n. The connecting node of the resistors R11 and R12 is connected to the mixing node Mxd. The resistors R11 and R12 of the specific example are equivalent to the resistor R1 in FIG. 1.

Similarly, the output Ot3 in FIG. 1 corresponds to the emitter output Ot3p of the positive-side transistor Q3p and the emitter output Ot3n of the negative-side transistor Q3n in FIG. 3. Resistors R21 and R22 are connected in series between the emitter outputs Ot3p and Ot3n. The connecting node of the resistors R21 and R22 is connected to one terminal of the inductor L1. The resistors R21 and R22 of the specific example are equivalent to the resistor R2 in FIG. 1.

In the specific example, the emitter outputs Ot2p and Ot2n act as alternating current voltage sources with identical outputs and can be regarded as a single voltage source. By setting the resistors R11 and R12 to 91Ω, a resistance of 45.5Ω, corresponding to the resistor R1, is placed between the single voltage source and the mixing node Mxd. Similarly, the emitter outputs Ot3p and Ot3n act as alternating current voltage sources with identical outputs, by setting the resistors R21 and R22 to 0.22Ω and the inductor L1 to 5 mH, a resistance of 0.11 ohm, corresponding to the resistor R2, and a 5 mH inductor connected in series are placed between the single voltage source and the mixing node Mxd. In this manner, the power amplifier 1b of the FIG. 3 is a specific example that is equivalent to the power amplifier 1a of FIG. 1.

In the specific example of FIG. 3, the amplifiers 12 and 13 are configured as emitter followers using bipolar transistors, but can be configured as source followers using field-effect transistors. Further, Darlington-connected transistors can be used for the emitter followers and the source followers.

Figure 4:
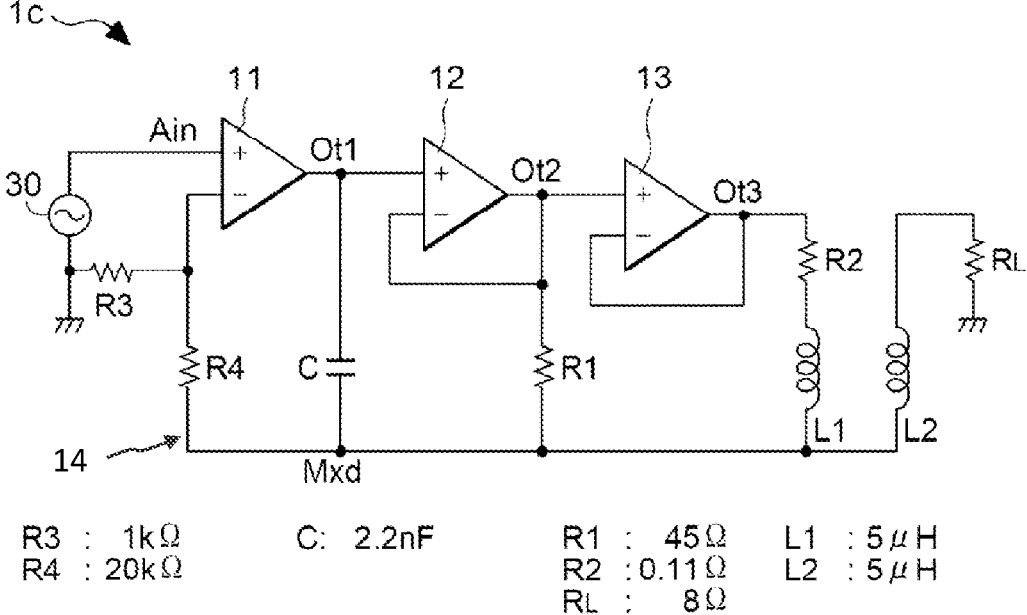
FIG. 4 is a diagram showing a first modified example of the power amplifier.

FIG. 4 is a circuit diagram of a power amplifier 1c according to a first modified example of the power amplifier 1a of FIG. 1. The power amplifier 1a according to the embodiment is a voltage buffer with a closed loop gain of "1" (=0 dB) to which 100% negative feedback has been applied is: however, the power amplifier 1c according to the first modified example has a prescribed gain with negative feedback of less than 100% by resistors R3 and R4. More specifically, the resistor R3 is connected between the inverting input (−) of the amplifier 11 and ground, and the resistor R4 is connected between the inverting input (−) of the amplifier 11 and the mixing node Mxd; thus, the power amplifier 1c has a closed loop gain (voltage gain) of (R3+R4)/R3 at the mixing node Mxd. In the first modified example, the amplifier 11 is designed so that the open loop gain before negative feedback is applied is higher than the open loop gain shown in FIG. 2 by its voltage gain (that is, higher by (R3+R4)/R3) over the entire range, in order to keep the amount of feedback of each band in the decibel scale the same as in the circuit of FIG. 1. With respect to the amplifier 11 of FIG. 1, by making modifications such as using an element with the same frequency characteristics but with higher gain or increasing the number of voltage amplification stages, the open loop gain of FIG. 2 (embodiment) can be shifted up by an amount corresponding to the voltage gain without significantly changing its shape. As a result, the frequency response of the closed loop gain of the power amplifier 1b will be almost the same as that of the power amplifier 1a of FIG. 1. For example, in the first modified example, when the resistor R3 is 1 kΩ and the resistor R4 is 20Ω, the closed loop gain of the power amplifier 1c is 21 (≈26 dB). The upper limit of the bandwidth where the closed loop gain is flat remains at 20 MHz.

Figure 5:
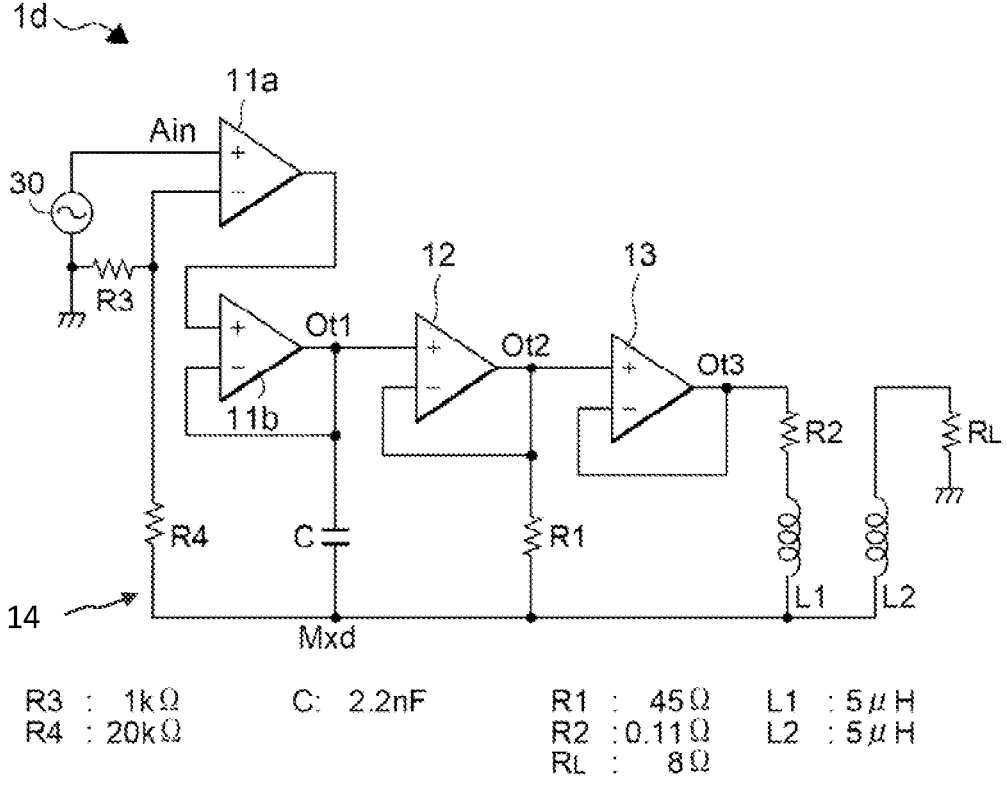
FIG. 5 is a diagram showing a second modified example of the power amplifier.

FIG. 5 shows a circuit diagram of a power amplifier 1d according to a second modified example, which is a further modification of the power amplifier 1c with voltage gain. In the power amplifiers 1a and 1c according to the embodiment, the amplifiers 12 and 13 are voltage buffers, but the driving power of the amplifier 11 can be increased by providing a voltage buffer 11b at the output of amplifier 11 to form amplifiers 11a and 11b, as shown in FIG. 5. The amplifier 11a is a high-gain operational amplifier, and the voltage buffer 11b has a voltage amplification factor of "1."

The values of the passive elements in the second modified example are the same as those of the first modified example of FIG. 4, and the power amplifier 1d has a voltage gain of approximately 26 dB up to 20 MHz, the upper limit frequency the bandwidth of Like the amplifier 11, the amplifier 11a is an operational amplifier, which can be formed by discrete circuits, an integrated circuit, or be a mixture of the two. Like the amplifiers 12 and 13, the voltage buffer 11*b* can be a source follower or an emitter follower which includes complementary transistors.

Preferred aspects of this disclosure can be understood from the foregoing description, such as the following.

A power amplifier according to one aspect (first aspect) comprises a first amplifier that amplifies an input signal and outputs this amplified signal from a first output as a first signal, a second amplifier that amplifies the first signal and outputs this amplified signal from a second output as a second signal, a third amplifier that amplifies the second signal and outputs this amplified signal from a third output as a third signal, a capacitor connected between the first output and a mixing node, a first resistor connected between the second output and the mixing node, a first inductor connected between the third output and the mixing node, a second inductor connected between the mixing node and a load, and a feedback loop that negatively feeds back the mixed signal at the mixing node to an input of the first amplifier.

By the first aspect, more negative feedback can be stably applied than a conventional power amplifier at higher frequencies beyond the audible band, and various characteristics can be improved, such as the distortion characteristics in the audible band. High-speed distortion that cannot be removed by negative feedback through the relatively low-speed third amplifier can be reduced by negative feedback through the faster second amplifier, and faster distortion that cannot be removed by the aforementioned second amplifier can be reduced by negative feedback of the even faster first amplifier. Here, feed-forward is not used, and high-precision circuit components are not required.

The audible band refers to the range of sound frequencies that can be heard by the human ear, specifically, the frequency range of 20 Hz to 20 kHz. The second inductor is primarily intended to prevent oscillations caused by parasitic capacitance of the cable from the output of the power amplifier to the load, but can also prevent the destruction of the first amplifier and the second amplifier due to over-currents.

In a specific second aspect of the first aspect, the resistance value of the first resistor and the inductance of the first inductor are set so that the first crossover frequency of the second signal that has passed through the first resistor and the third signal that has passed through the first inductor is higher than the roll-off frequency that is set from the inductance of the second inductor and the resistance value of the load.

In the second aspect, at the first crossover frequency, the impedance of the second inductor is greater than load resistance, and, since there are almost no such high-frequency components in the input signal, it is extremely unlikely that the load current will exceed the maximum current that can be handled by the second amplifier. Further, by sufficiently spacing the roll-off frequency and the first crossover frequency, it can be ensured that the load current will be below the maximum current that can be handled by the second amplifier.

In a specific third aspect of the second aspect, the capacitance value of the capacitor and the resistance value of the first resistor are set so that the second crossover frequency of the first signal that has passed through the capacitor and the second signal that has passed through the first resistor is higher than the first crossover frequency.

By the third aspect, in which the second crossover frequency is set higher than the first crossover frequency, the load current will be even smaller at the second crossover frequency than at the first crossover frequency, so that even in the first amplifier, which can handle a smaller maximum current than the second amplifier, it is extremely unlikely that the load current will exceed the aforementioned maximum current.

In another specific fourth aspect of the first aspect, the second amplifier and the third amplifier are emitter followers or source followers. If the constituent elements of the second amplifier and the third amplifier are bipolar transistors, emitter followers are preferred, and if the constituent elements are field-effect transistors, source followers are preferred.

In another specific fifth aspect of the first aspect, the closed loop gain of the power amplifier in the audible band by negative feedback of the feedback loop is a fixed value of 1 or more.

By the fifth aspect, it is possible to further reduce distortion by increased negative feedback in the high-frequency band including the band that exceeds the audible range, and to make the voltage gain over the entire band including the audible range constant.

What is claimed is:

1. A power amplifier comprising:
   a first amplifier configured to amplify an input signal and output, from a first output, a first signal in which the input signal is amplified;
   a second amplifier configured to amplify the first signal and output, from a second output, a second signal in which the first signal is amplified;
   a third amplifier configured to amplify the second signal and output, from a third output, a third signal in which the second signal is amplified;
   a capacitor connected between the first output and a mixing node;
   a first resistor connected between the second output and the mixing node;
   a first inductor connected between the third output and the mixing node;
   a second inductor connected between the mixing node and a load; and
   a feedback circuit configured to negatively feed back a mixed signal of the mixing node to an input of the first amplifier.

2. The power amplifier according to claim 1, wherein
   a resistance value of the first resistor and an inductance of the first inductor are set such that a first crossover frequency of the second signal that has passed through the first resistor and the third signal that has passed through the first inductor is higher than a roll-off frequency that is set from an inductance of the second inductor and a resistance value of the load.

3. The power amplifier according to claim 2, wherein
   a capacitance value of the capacitor and the resistance value of the first resistor are set such that a second crossover frequency of the first signal that has passed through the capacitor and the second signal that has passed through the first resistor is higher than the first crossover frequency.

4. The power amplifier according to claim 1, wherein
   the second amplifier and the third amplifier are emitter followers or source followers.

5. The power amplifier according to claim 1, wherein
   a closed loop gain of an output signal with respect to the input signal in an audible range by the feedback circuit is a fixed value of 1 or more.

\* \* \* \* \*